United States Patent
Jiang et al.

(10) Patent No.: US 10,622,979 B2
(45) Date of Patent: Apr. 14, 2020

(54) DELAY CELL

(71) Applicant: TEXAS INSTRUMENTS INCORPORATED, Dallas, TX (US)

(72) Inventors: Yanfei Jiang, Frisco, TX (US); Huanzhang Huang, Plano, TX (US); Yonghui Tang, Plano, TX (US); Shita Guo, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/367,381

(22) Filed: Mar. 28, 2019

(65) Prior Publication Data

US 2020/0059224 A1 Feb. 20, 2020

Related U.S. Application Data

(60) Provisional application No. 62/719,830, filed on Aug. 20, 2018.

(51) Int. Cl.
| | | |
|---|---|---|
| *H03K 5/00* | (2006.01) | |
| *H03K 5/1252* | (2006.01) | |
| *H03K 19/20* | (2006.01) | |
| *H03K 19/0175* | (2006.01) | |
| *G05F 1/46* | (2006.01) | |

(52) U.S. Cl.
CPC .................. *H03K 5/00* (2013.01); *G05F 1/46* (2013.01); *H03K 5/1252* (2013.01); *H03K 19/017509* (2013.01); *H03K 19/20* (2013.01); *H03K 2005/00078* (2013.01)

(58) Field of Classification Search
CPC ........ H03K 5/1252; H03K 5/125; H03K 5/00; H03K 19/20; H03K 19/017509; H03K 19/0175; G05F 1/46
See application file for complete search history.

(56) References Cited

U.S. PATENT DOCUMENTS

| | | | |
|---|---|---|---|
| 6,747,498 B1 * | 6/2004 | Pauletti | H04L 12/40032 327/198 |
| 6,914,467 B2 | 7/2005 | Feng et al. | |
| 2006/0056210 A1 * | 3/2006 | Yamada | H02M 1/4208 363/63 |
| 2007/0103204 A1 | 5/2007 | Egan et al. | |
| 2009/0256599 A1 | 10/2009 | Shinomiya et al. | |
| 2010/0289540 A1 | 11/2010 | Kurihara | |
| 2016/0080183 A1 * | 3/2016 | Yun | H04L 27/06 375/320 |

OTHER PUBLICATIONS

International Search Report in corresponding PCT Application No. PCT/US2019/046765, dated Nov. 21, 2019 (2 pages).

* cited by examiner

*Primary Examiner* — Lincoln D Donovan
*Assistant Examiner* — Diana J. Cheng
(74) *Attorney, Agent, or Firm* — John R. Pessetto; Charles A. Brill; Frank D. Cimino

(57) ABSTRACT

Aspects of the disclosure provide for a method. In some examples, the method includes detecting a transition in an input signal (IN), generating a bias current based on the detected transition in IN, and modifying a charge status of a capacitor based on the charge current. The method further includes generating an output signal (OUT) based on the charge status of the capacitor, disabling the bias current generation based on values of IN and OUT, and strongly pulling the capacitor up or down based on the disabling the bias current generation.

12 Claims, 6 Drawing Sheets understand

DELAY CELL

CROSS-REFERENCE TO RELATED APPLICATIONS

The present application claims priority to U.S. Provisional Patent Application No. 62/719,830, which was filed Aug. 20, 2018, is titled "COMPACT LOW POWER DELAY CELL," and is hereby incorporated herein by reference in its entirety.

SUMMARY

Aspects of the present disclosure provide for a circuit. In some examples, the circuit includes a signal detection circuit having a first input configured to receive an input signal (IN), a second input configured to receive an output signal (OUT), and an output. The circuit further includes a first n-type field effect transistor (FET)(nFET) having a gate terminal coupled to the output of the signal detection circuit, a drain terminal, and a source terminal coupled to a first node. The circuit further includes a resistor coupled between the drain terminal of the first nFET and a second node, a first current mirror coupled between the first node and a third node, and a second current mirror coupled between the second node and a fourth node. The circuit further includes a first p-type FET (pFET) having a gate terminal configured to receive IN, a source terminal coupled to the fourth node, and a drain terminal coupled to a fifth node. The circuit further includes a second nFET having a gate terminal configured to receive IN, a source terminal coupled to the third node, and a drain terminal coupled to the fifth node. The circuit further includes a capacitor coupled between the fifth node and a ground terminal and a Schmitt trigger having an input coupled to the fifth node and an output coupled to a sixth node, wherein the Schmitt trigger is configured to provide OUT at the sixth node.

Other aspects of the disclosure provide for a method. In some examples, the method includes detecting a transition in IN, generating a bias current based on the detected transition in IN, and modifying a charge status of a capacitor based on the charge current. The method further includes generating OUT based on the charge status of the capacitor, disabling the bias current generation based on values of IN and OUT, and strongly pulling the capacitor up or down based on the disabling the bias current generation.

Other aspects of the disclosure provide for a system. In some examples, the system includes a first power on reset (PoR) circuit having an input configured to receive a first supply voltage. The system further includes a second PoR circuit having an input configured to receive a second supply voltage, a buffer configured to receive a reset signal and output a buffered reset signal, and a glitch filter configured to receive the buffered reset signal and generate a delayed internal reset signal. The system further includes a first logic circuit configured to output a first logic output signal based on a value of an output signal of the first PoR circuit and the internal reset signal, a second logic circuit configured to output a first control signal based on a value of an output signal of the second PoR circuit and an output signal of the first logic output circuit, and a delay cell configured to receive the first control signal and generate a second control signal having a value reflecting a value of the first control signal after a first delay period.

BRIEF DESCRIPTION OF THE DRAWINGS

For a detailed description of various examples, reference will now be made to the accompanying drawings in which.

DETAILED DESCRIPTION

In various systems and circuit architectures, delay cells are implemented to delay output of a signal based on an input signal. At least some architectures in which delay cells are implemented include glitch filters, sequencing, power supervisors, and/or power-up management circuits. The most basic of delay cells is a resistor-capacitor (RC) timer, where a resistance of the resistor and a capacitance of the capacitor determine a time to charge the capacitor, which equates to a delay of the RC timer delay cell. However, as process technologies advance and it becomes advantageous to minimize both surface area and power consumption in supporting devices such as power cells. For example, in some architectures it is desirable for elements such as delay cells to consume approximately no static current and consume a minimum possible die surface area. A RC timer delay cell, in order to generate large delay values, requires physically large components, rendering the basic RC timer delay cell unsuitable for many modern architectures. Other delay cells, such as I over C delay cells, are unsuitable for some modern architectures because of their static current consumption (e.g., power consumed while the delay cell is in an idle state, such as a power sequence control delay cell after a power-up is completed). Accordingly, in at least some architectures it is desirable to provide a delay cell with minimal to no static current consumption and a minimal size.

At least some aspects of the present disclosure provide for a circuit. The circuit is, in some examples, suitable for implementation as a delay cell. The delay cell, in some examples, generates a delay based on a time to charge (or discharge) a capacitor having capacitance (C) given the presence of a current having a value (I). The delay cell, in some examples, has a controllable bias current generation arm configured such that a bias current is only generated and power consumed by the circuit when a delay is being implemented and power is not consumed when the bias current generation arm is turned off, advantageously reducing static power consumption of the circuit to approximately zero. In some examples, the circuit further includes one or more switches configured to rapidly charge or discharge the capacitor. The circuit further includes a Schmitt trigger configured to generate an output signal based on a value present at a node coupled to a top plate of the capacitor.

Figure 1:
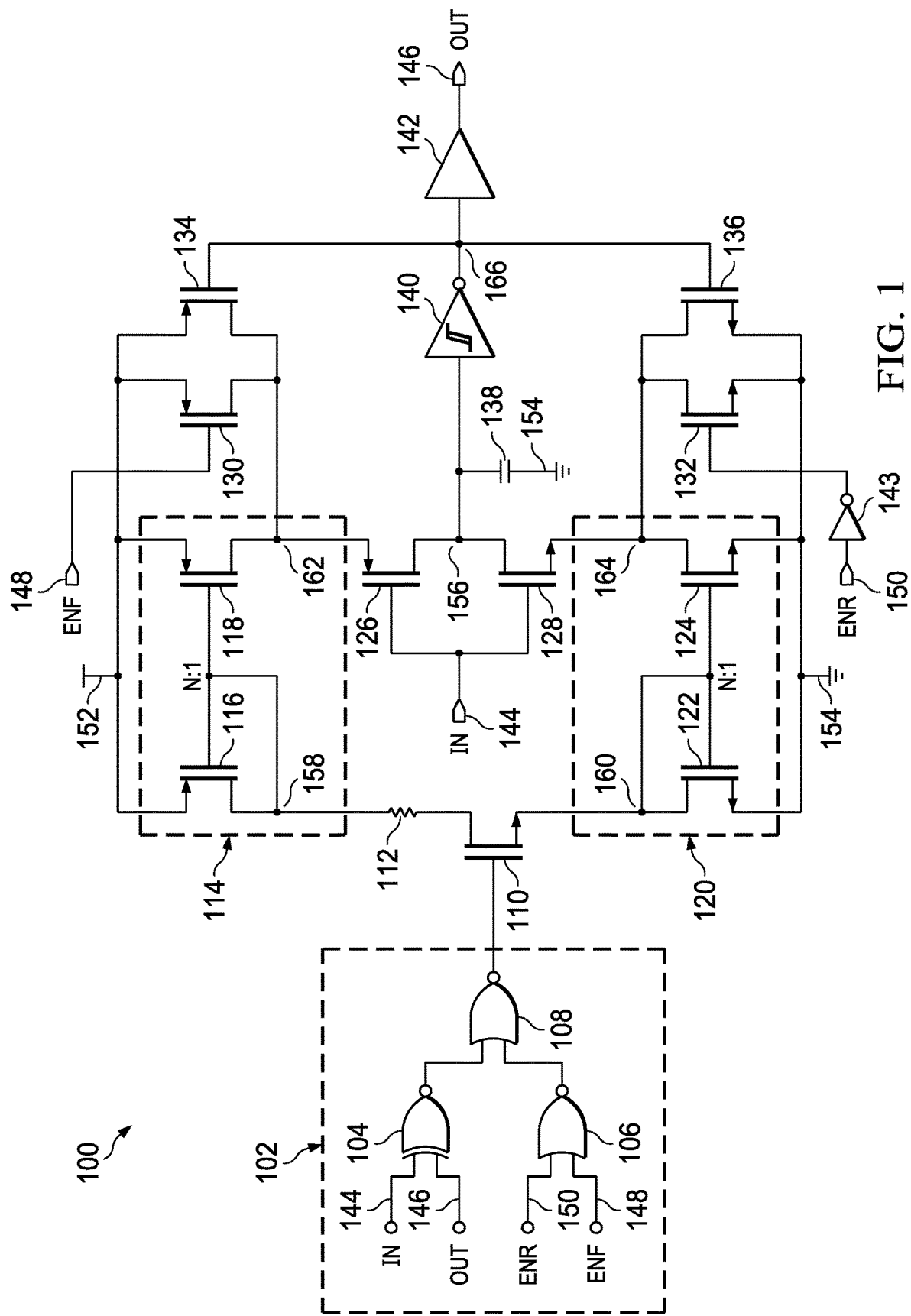
FIG. 1 shows a schematic diagram of an illustrative circuit in accordance with various examples.

Turning now to FIG. 1, a schematic diagram of an illustrative circuit 100 is shown. In at least some examples, the circuit 100 is suitable for implementation as a delay cell. The circuit 100, when implemented as a delay cell, is suitable for implementation as a standalone component or implementation as a component of another architecture (e.g., such as at least partially incorporated into a silicon die with one or more other components or devices). In some examples, the circuit 100 includes a signal sensing circuit 102 that includes an exclusive not-OR (XNOR) logic circuit 104, a NOR logic circuit 106, and a NOR logic circuit 108. The circuit 100 further includes a n-type field effect transistor (FET) (nFET) 110, a resistor 112, a current mirror 114 that includes a p-type FET (pFET) 116 and a pFET 118, a current mirror 120 that includes a nFET 122 and a nFET 124, a pFET 126, a nFET 128, a pFET 130, a nFET 132, a pFET 134, a nFET 136, a capacitor 138, a Schmitt trigger 140, a buffer 142, and an inverter 143.

In at least some examples, the XNOR logic circuit 104, the NOR logic circuit 106, and the NOR logic circuit 108 are each implementable using any suitable analog and/or digital components that when coupled together provide the XNOR or NOR logical operations. The resistor 112 is representative of any one or more resistive elements such that in some examples a resistance value of the resistor 112 is programmable. Moreover, the resistor 112 provides for setting of a current value. In at least some examples in which this functionality is not desired, the resistor 112 is omitted. Additionally, in some examples the resistor 112 is merely representative of any component or device having a selectable and/or controllable amount of resistance, such as one or more FETs. The capacitor 138 is representative of any one or more capacitive elements such that in some examples a capacitance value of the capacitor 138 is programmable. In at least some examples, the pFET 130, the nFET 132, and the inverter 143 are omitted from the circuit 100. In such examples, in some implementations the NOR logic circuit 106 and/or the NOR logic circuit 108 are also omitted from the circuit 100.

In an example architecture of the circuit 100, a first input of the XNOR logic circuit 104 is coupled to a node 144 and a second input of the XNOR logic circuit 104 is coupled to a node 146. A first input of the NOR logic circuit 106 is coupled to a node 148 and a second node of the NOR logic circuit 106 is coupled to a node 150. A first input of the NOR logic circuit 108 is coupled to an output of the XNOR logic circuit 104 and a second input of the NOR logic circuit 108 is coupled to an output of the NOR logic circuit 106. An output of the NOR logic circuit 108 is coupled to a gate terminal of the nFET 110. The resistor 112 is coupled between a node 158 and a drain terminal of the nFET 110 and a source terminal of the nFET 110 is coupled to a node 160. A drain terminal and a gate terminal of the pFET 116 are coupled to the node 158 and a source terminal of the pFET 116 is coupled to the node 152. A gate terminal of the pFET 118 is coupled to the node 158, a drain terminal of the pFET 118 is coupled to a node 162, and a source terminal of the pFET 118 is coupled to the node 152. A gate terminal and a drain terminal of the nFET 122 are coupled to the node 160 and a source terminal of the nFET 122 is coupled to a node 154. A gate terminal of the nFET 124 is coupled to the node 160, a drain terminal of the nFET 124 is coupled to a node 164, and a source terminal of the nFET 124 is coupled to the node 154.

A source terminal of the pFET 126 is coupled to the node 162, a source terminal of the pFET 126 is coupled to a node 156, and a gate terminal of the pFET 126 is coupled to the node 144. A source terminal of the nFET 128 is coupled to the node 164, a drain terminal of the nFET 128 is coupled to the node 156, and a gate terminal of the nFET 128 is coupled to the node 144. A source terminal of the pFET 130 is coupled to the node 152, a drain terminal of the pFET 130 is coupled to the node 162, and a gate terminal of the pFET 130 is coupled to the node 148. A source terminal of the nFET 132 is coupled to the node 154, a source terminal of the nFET 132 is coupled to the node 164, and a gate terminal of the nFET 132 is coupled to an output of the inverter 143. A source terminal of the pFET 134 is coupled to the node 152, a drain terminal of the pFET 134 is coupled to the node 162, and a gate terminal of the pFET 134 is coupled to a node 166. A source terminal of the nFET 136 is coupled to the node 154, a drain terminal of the nFET 136 is coupled to the node 164, and a gate terminal of the nFET 136 is coupled to the node 166. The capacitor 138 is coupled between the node 156 and the node 154. The Schmitt trigger 140 has an input coupled to the node 156 and an output coupled to the node 166. The buffer 142 has an input coupled to the node 166 and an output coupled to the node 146. The inverter 143 has an input coupled to the node 150. The Schmitt trigger 140, as illustrated in FIG. 1, is an inverting Schmitt trigger such that a polarity of OUT follows a polarity of IN. In other examples, the Schmitt trigger 140 is implemented as a non-inverting Schmitt trigger having an output coupled to an inverter (not shown) that is coupled between the output of the Schmitt trigger 140 and the node 166. In yet other examples, the Schmitt trigger 140 is implemented as a non-inverting Schmitt trigger and the buffer 142 is implemented as an inverter to invert the output of the Schmitt trigger 140 to generate OUT such that the polarity of OUT follows the polarity of IN. In the examples in which the buffer 142 is an inverter, the gate terminal of the pFET 134 and the gate terminal of the nFET 136 are each coupled to the node 146 instead of the node 166.

In at least some examples, the circuit 100 is configured to receive an input signal (IN) at the node 144 and provide an output signal (OUT) at the node 146. The node 148 is configured to receive a falling edge delay enable signal (ENF) and the node 150 is configured to receive a rising edge delay enable signal (ENR). The node 152 is configured to couple to a voltage supply and the node 154 is configured to couple to a ground potential. In at least some examples, the node 154 does not couple to a ground potential but instead also couples to another voltage supply providing a different voltage signal than the voltage supply to which the node 152 is configured to couple, and reference herein with respect to the node 154 and the ground potential instead correspond to the voltage supply to which the node 154 couples.

In an example of operation of the circuit 100, a change in value of IN received at the node 144 is delayed prior to providing OUT at the node 146 having a same value as IN. For example, when both IN and out are a logic '0' and IN transitions to a logic '1', OUT does not also transition to the logic '1' until an expiration of the delay implemented by the circuit 100. The delay is determined, in at least some examples, by an amount of current flowing through the node 156 divided by a capacitance of the capacitor 138. When IN and OUT each have a same value, an output of the XNOR logic circuit 104 is a logical '1' such that an output of the NOR logic circuit 108 is a logical '0' and the nFET 110 is turned off (e.g., controlled to not conduct current between its source and drain terminals). When IN transitions from the logical '0' to the logical '1', the XNOR logic circuit 104 outputs a logical '0'. When at least one of ENR or ENF is a logical '1', signifying that either rising edge delay or falling edge delay, respectively, is enabled in the circuit 100, the NOR logic circuit 106 outputs a logical '0'. Otherwise, with neither ENR nor ENF is a logical '1', signifying that delay functionality of the circuit 100 is disabled, the NOR logic circuit 106 outputs a logical '1'. When either input received by the NOR logic circuit 108 is a logical '1', the NOR logic circuit 108 outputs a logical '0' that maintains the nFET 110 turned off. When neither input received by the NOR logic circuit 108 is a logical '1' (e.g., signifying that IN and OUT vary in value and delay is enabled in the circuit 100), the NOR logic circuit 108 outputs a logical '1' that turns on the nFET 110 (e.g., controls the nFET 110 to conduct current between its source and drain terminals). In this way, only when IN and OUT vary in value and a delay is needed in the circuit 100 does current flow through the resistor 112, consuming power. When a delay is not needed because IN and OUT have a same value, no static current flows through the resistor 112 and no power is consumed.

When the nFET 110 is conducting current, an amount of current flowing through the resistor 112 from a voltage source coupled to the node 152 is mirrored by the current mirror 114 from the node 158 to the node 162 and by the current mirror 120 from the node 160 to the node 164. When IN transitions from a logical '0' to a logical '1', the pFET 126 is turned off and the nFET 128 is turned on, conducting between the node 156 and the node 164, creating a path to the ground potential coupled to the node 154 from the capacitor 138 through the node 156, nFET 128, and nFET 124. The capacitor 138 discharges through this path, with a discharge rate of the capacitor 138 determined by the current flow through nFET 124 which is mirrored from the nFET 122 and divided by the capacitance value of capacitor 138. When a voltage present at the node 156 (e.g., a voltage of the capacitor 138, as present at the top plate of the capacitor 138) falls below a threshold for triggering the Schmitt trigger 140, the Schmitt trigger 140 activates, changing states such that a value present at the node 166, and subsequently buffered and provided to the node 146 by the buffer 142 as OUT, is approximately equal to IN. As discussed above, when IN and OUT have approximately a same value, no current flows through the resistor 112 so both the current mirror 114 and the current mirror 120 are off, causing the node 156 to become uncontrolled and be floating. To hold or lockdown the node 156, when the Schmitt trigger 140 outputs the logical "1" to the node 166, the nFET 136 turns on, creating an alternative path to the node 154 from the node 156 and rapidly discharging any remaining charge stored by the capacitor 138.

In at least some examples, the above explanation assumes that ENR is a logical '1', indicating that rising edge delay is enabled. When ENR is instead '0', the nFET 132 is turned on, creating a lower resistance path to the node 154 from the node 156 than is provided by the nFET 124 operating as a constant current sink resulting from the current being mirrored by the current mirror 120. In this example, the capacitor 138 discharges rapidly through the nFET 132 (e.g., resulting from a comparatively low on resistance of the nFET 132 compared to a resistance of the nFET 124 operating as a constant current sink) with approximately no delay such that little to no delay exists between a rising edge transition in IN and a corresponding rising edge transition in OUT.

When IN transitions from a logical '1' to a logical '0', the nFET 128 is turned off and the pFET 126 is turned on, conducting between the node 156 and the node 162, creating a path to the voltage supply coupled to the node 152 from the capacitor 138 through the node 156, pFET 126, and pFET 118. The capacitor 138 charges through this path, with a charge rate of the capacitor 138 determined by the current flow through pFET 118 which is mirrored from the pFET 116 and divided by the capacitance value of capacitor 138. When a voltage present at the node 156 (e.g., a voltage of the capacitor 138, as present at the top plate of the capacitor 138) rises above the threshold for triggering the Schmitt trigger 140, the Schmitt trigger 140 activates, changing states such that a value present at the node 166, and subsequently buffered and provided to the node 146 by the buffer 142 as OUT, is approximately equal to IN. As discussed above, when IN and OUT have approximately a same value, no current flows through the resistor 112 so both the current mirror 114 and the current mirror 120 are off, causing the node 156 to become uncontrolled and be floating. To hold or lockdown the node 156, when the Schmitt trigger 140 outputs the logical "0" to the node 166, the pFET 134 turns on, creating an alternative path to the node 152 from the node 156 and rapidly charging any remaining available charge capacity of the capacitor 138 such that the capacitor 138 becomes fully charged.

In at least some examples, the above explanation assumes that ENF is a logical '1', indicating that falling edge delay is enabled. When ENF is instead '0', the pFET 130 is turned on, creating a lower resistance path to the node 152 from the node 156 than is provided by the pFET 118 operating as a constant current source resulting from the current being mirrored by the current mirror 114. In this example, the capacitor 138 charges rapidly through the pFET 130 (e.g., resulting from a comparatively low on resistance of the pFET 130 compared to a resistance of the pFET 118 operating as a constant current source) with approximately no delay such that little to no delay exists between a falling edge transition in IN and a corresponding falling edge transition in OUT.

In this way, the circuit 100 draws current (e.g., consumes power) only when implementing a delay in a signal received as IN at the node 144 and not during static or steady-state conditions when IN and OUT have approximately a same value. Therefore, the circuit 100 advantageously reduces current draw of a delay cell and reduces a cost of operation of the circuit 100 as a delay cell.

Figure 2:
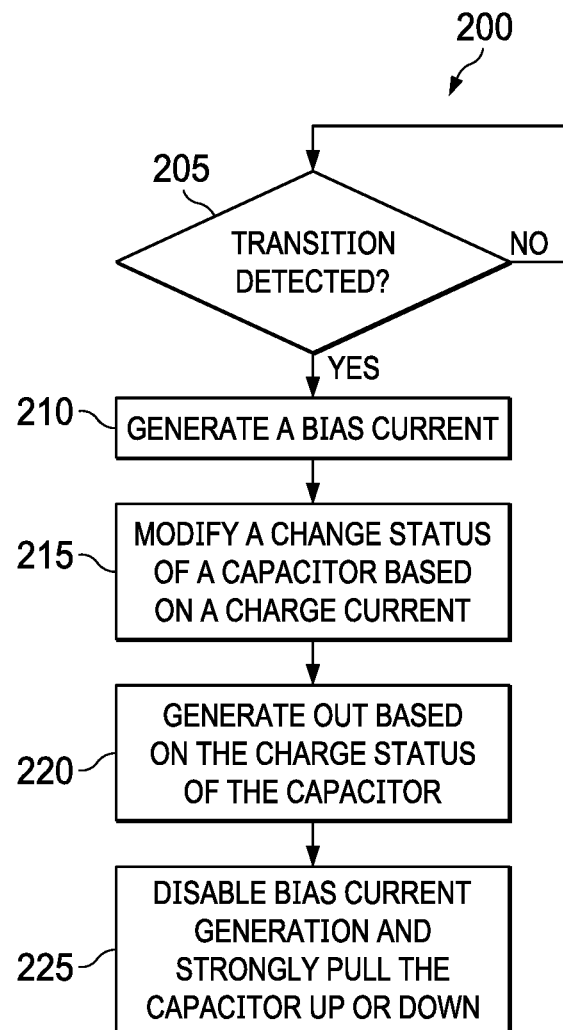
FIG. 2 shows a flowchart of an illustrative method in accordance with various examples.

Turning now to FIG. 2, a flowchart of an illustrative method 200 is shown. In at least some examples, the method 200 corresponds to actions performed by one or more components of the circuit 100. The method 200 is, in some examples, a method for controlling generation of a hardware delay. Implementation of the method 200 by a circuit, in at least some examples, is advantageous in generating a hardware delay while consuming a minimal physical surface area and having no, or approximately no, static current consumption.

At operation 205, a transition in a signal is detected. The transition is, in some examples, a transition in an input signal (IN) of the circuit. In other examples, the transition is a transition in an output signal (OUT) of the circuit. The transition is detected, in some examples, by performing a logical operation based on IN and OUT. The logical operation, in at least some examples, is an inverted exclusive OR (XNOR) operation that outputs a logical '1' when neither the IN nor OUT has a logical '1' value, outputs a logical '1' when both IN and OUT have logical '1' values, and outputs a logical '0' for other value combinations of IN and OUT. In at least some examples, if no transition in either IN or OUT is detected, bias current generation is not enabled (e.g., is disabled) by the method 200. In this way, in at least some examples, no power is consumed in implementing the method 200 when OUT has a same value as IN.

At operation 210, a bias current is generated. The bias current is generated, in at least some examples, by controlling a transistor to conduct current based on the detection of the transition in the signal. Controlling a transistor to conduct current, in some examples, completes a circuit that enables current to flow through a resistor, establishing the bias current that is then mirrored, with or without scaling, by one or more current mirrors to form a charge current.

At operation 215, a charge status of a capacitor is modified based on the charge current. In some examples, changing the charge status of the capacitor includes discharging the capacitor (e.g., such as when the detected transition was a rising edge transition). In other examples, changing the charge status of the capacitor includes charging the capacitor (e.g., such as when the detected transition was a falling edge transition).

At operation 220, OUT is generated based on the charge status of the capacitor. For example, when a voltage of the capacitor, determined based on at least the charge current and the capacitance of the capacitor) rises above or falls below a threshold, OUT is generated to have substantially a same value as IN. A delay in a value of OUT with respect to a value of IN, in at least some examples, depends on a charge or discharge time of the capacitor having the modified charge status at operation 215.

At operation 225, the bias current generation is disabled and the charge status of the capacitor is pulled strongly up to supply voltage to quickly charge remainder of capacity of the capacitor or pulled strongly down to a ground potential to quickly discharge any remaining charge stored by the capacitor. The capacitor is pulled strongly up or strongly down, in some examples, to prevent the top plate of the capacitor from floating when the bias current generation is disabled and creating unintended actions in the circuit and/or an erroneous value of OUT. The capacitor is pulled strongly up or strongly down, in some examples, by activation (e.g., such as through a transistor) of a low impedance path that bypasses a current mirror through which the capacitor was weakly pulled up or pulled down prior to activation of the low impedance path.

While the operations of the method 200 have been discussed and labeled with numerical reference, in various examples the method 200 includes additional operations that are not recited herein (e.g., such as intermediary comparisons, logical operations, output selections such as via a multiplexer, etc.), in some examples any one or more of the operations recited herein include one or more sub-operations (e.g., such as intermediary comparisons, logical operations, output selections such as via a multiplexer, etc.), in some examples any one or more of the operations recited herein is omitted, and/or in some examples any one or more of the operations recited herein is performed in an order other than that presented herein (e.g., in a reverse order, substantially simultaneously, overlapping, etc.), all of which is intended to fall within the scope of the present disclosure.

Figure 3A:
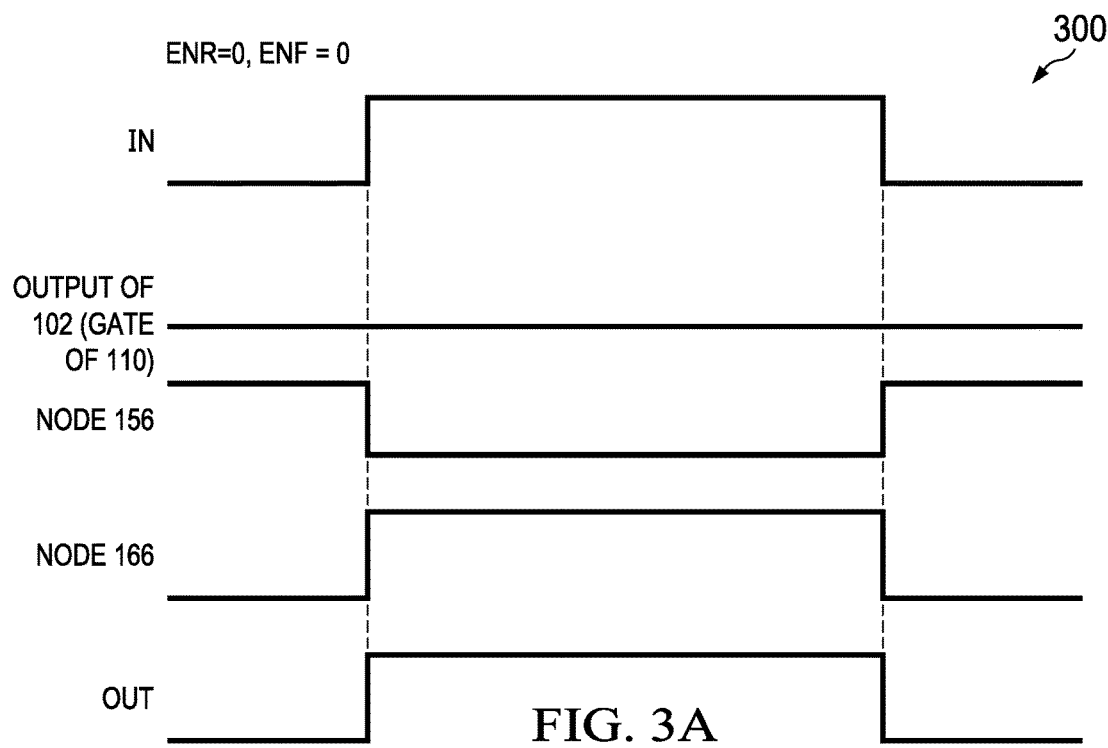
FIG. 3A shows a diagram of illustrative signal waveforms in accordance with various examples.

Turning now to FIG. 3A, a diagram 300 of illustrative waveforms is shown. In at least some examples, the diagram 300 is representative of at least some signals present in the circuit 100 of FIG. 1 when ENR has a logical '0' value and ENF has a logical '0' value. As shown in the diagram 300, ENR and ENF each having the logical '0' value causes the output of the signal sensing circuit 102 (e.g., as present at the gate terminal of the nFET 110) to have a logical '0' value. When the output of the signal sensing circuit is the logical '0' value, delay features of the circuit 100 are turned off, as described above with respect to FIG. 1, such that OUT and the node 166 track IN and the node 156 tracks IN as an inverse of IN.

Figure 3B:
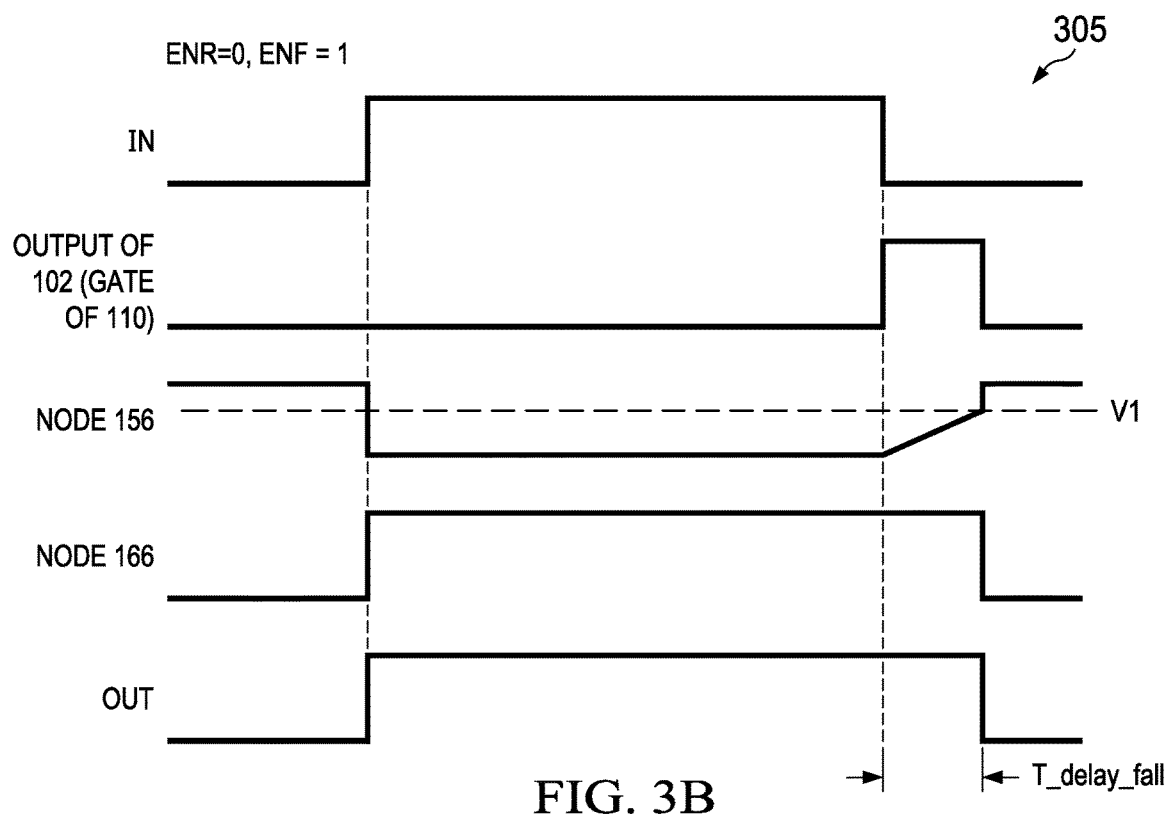
FIG. 3B shows a diagram of illustrative signal waveforms in accordance with various examples.

Turning now to FIG. 3B, a diagram 305 of illustrative waveforms is shown. In at least some examples, the diagram 305 is representative of at least some signals present in the circuit 100 of FIG. 1 when ENR has a logical '0' value and ENF has a logical '1' value. As shown in the diagram 305, ENR having the logical '0' value and ENF having the logical '1' value causes the output of the signal sensing circuit 102 (e.g., as present at the gate terminal of the nFET 110) to have a logical '1' value for a period of time T_delay_fall beginning at a falling edge of IN. When the output of the signal sensing circuit and ENF are each the logical '1' value, a falling edge delay feature of the circuit 100 is turned on, as described above with respect to FIG. 1, such that OUT and the node 166 track IN and the node 156 tracks IN as an inverse of IN until the rising edge in the output of the signal sensing circuit 102 (e.g., until a beginning of the delay period T_delay_fall). After the rising edge in the output of the signal sensing circuit 102, the capacitor 138 begins charging, increasing a value of the signal present at the node 156 until the value of the signal present at the node 156 exceeds a threshold v1 for triggering the Schmitt trigger 140, causing a value of the signal present at the node 166, and correspondingly OUT, to have a logical '0' value.

Figure 3C:
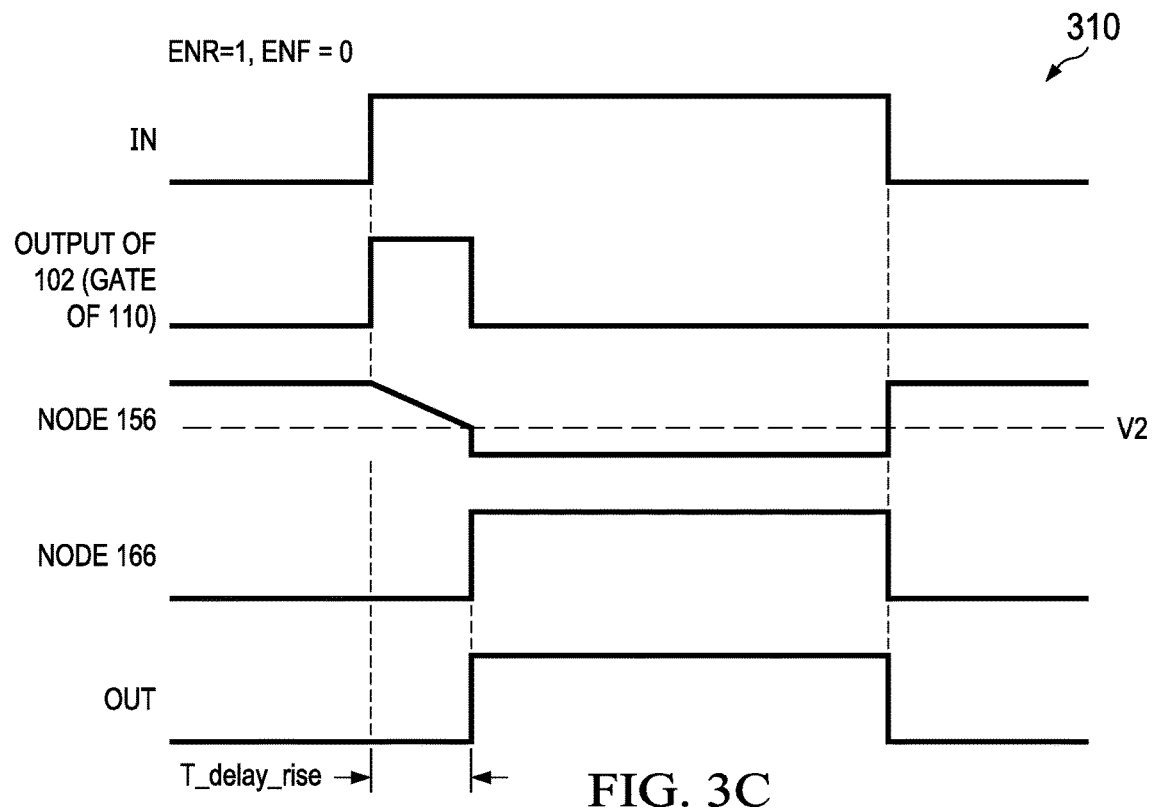
FIG. 3C shows a diagram of illustrative signal waveforms in accordance with various examples.

Turning now to FIG. 3C, a diagram 310 of illustrative waveforms is shown. In at least some examples, the diagram 310 is representative of at least some signals present in the circuit 100 of FIG. 1 when ENR has a logical '1' value and ENF has a logical '0' value. As shown in the diagram 310, ENR having the logical '1' value and ENF having the logical '0' value causes the output of the signal sensing circuit 102 (e.g., as present at the gate terminal of the nFET 110) to have a logical '1' value for a period of time T_delay_rise beginning at a rising edge of IN. When the output of the signal sensing circuit and ENR are each the logical '1' value, a rising edge delay feature of the circuit 100 is turned on, as described above with respect to FIG. 1, such that OUT and the node 166 track IN and the node 156 tracks IN as an inverse of IN after the falling edge in the output of the signal sensing circuit 102 (e.g., after an expiration of the delay period T_delay_rise). After the rising edge in the output of the signal sensing circuit 102, the capacitor 138 begins discharging, decreasing a value of the signal present at the node 156 until the value of the signal present at the node 156 falls below a threshold v2 for triggering the Schmitt trigger 140, causing a value of the signal present at the node 166, and correspondingly OUT, to have a logical '1' value.

Figure 3D:
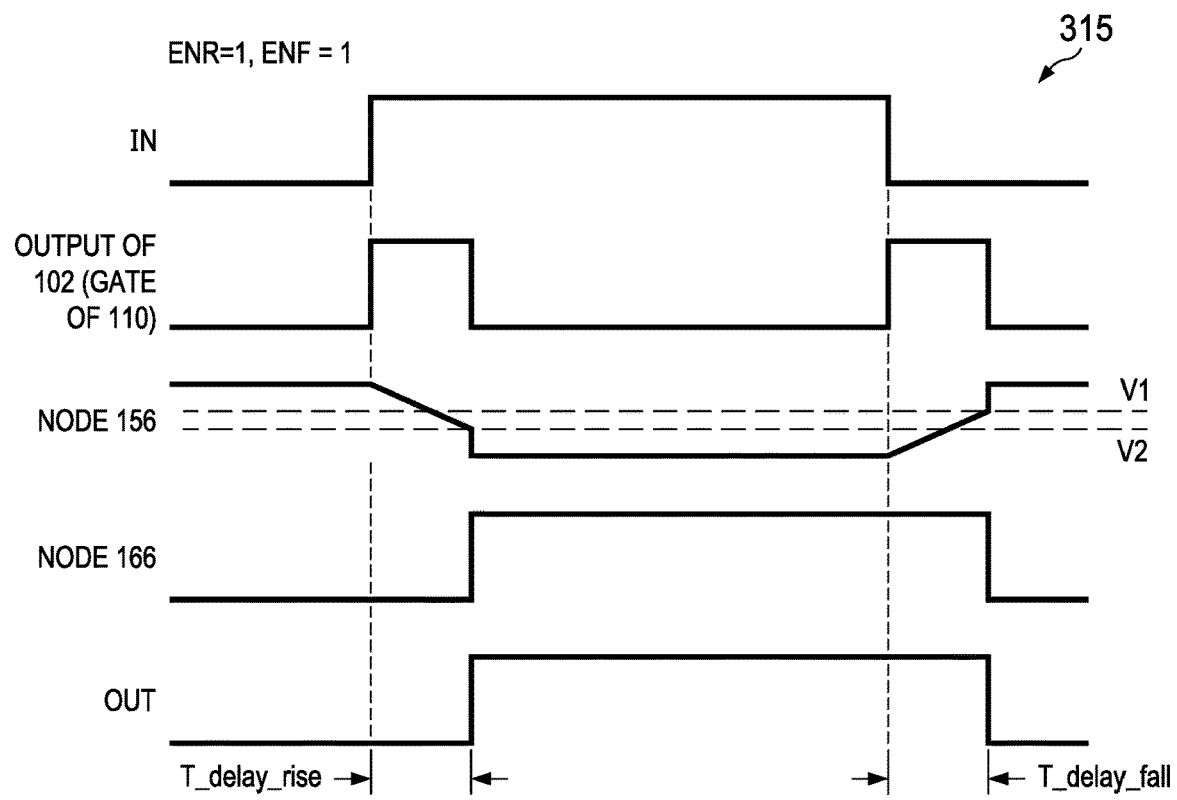
FIG. 3D shows a diagram of illustrative signal waveforms in accordance with various examples.

Turning now to FIG. 3D, a diagram 315 of illustrative waveforms is shown. In at least some examples, the diagram 315 is representative of at least some signals present in the circuit 100 of FIG. 1 when ENR has a logical '1' value and ENF has a logical '1' value. As shown in the diagram 315, ENR having the logical '1' value and ENF having the logical '1' value causes the output of the signal sensing circuit 102 (e.g., as present at the gate terminal of the nFET 110) to have a logical '1' value for a period of time T_delay_rise beginning at a rising edge of IN and for a period of time T_delay_fall beginning at a falling edge of IN._ When the output of the signal sensing circuit, ENR, and ENF are each the logical '1' value, both a rising edge delay feature and a falling edge delay feature of the circuit 100 are turned on, as described above with respect to FIG. 1, such that OUT and the node 166 track IN and the node 156 tracks IN as an inverse of IN after the falling edge in the output of the signal sensing circuit 102 (e.g., after an expiration of the delay period T_delay_rise) and until the rising edge in the output of the signal sensing circuit 102 (e.g., until a beginning of the delay period T_delay_fall). After the rising edge in the output of the signal sensing circuit 102 that begins T_delay_rise, the capacitor 138 begins discharging, decreasing a value of the signal present at the node 156 until the value of the signal present at the node 156 falls below a threshold v2 for triggering the Schmitt trigger 140, causing a value of the signal present at the node 166, and correspondingly OUT, to have a logical '1' value. After the rising edge in the output of the signal sensing circuit 102 that begins T_delay_fall, the capacitor 138 begins charging, increasing a value of the signal present at the node 156 until the value of the signal present at the node 156 exceeds a threshold v1 for triggering the Schmitt trigger 140, causing a value of the signal present at the node 166, and correspondingly OUT, to have a logical '0' value.

Figure 4:
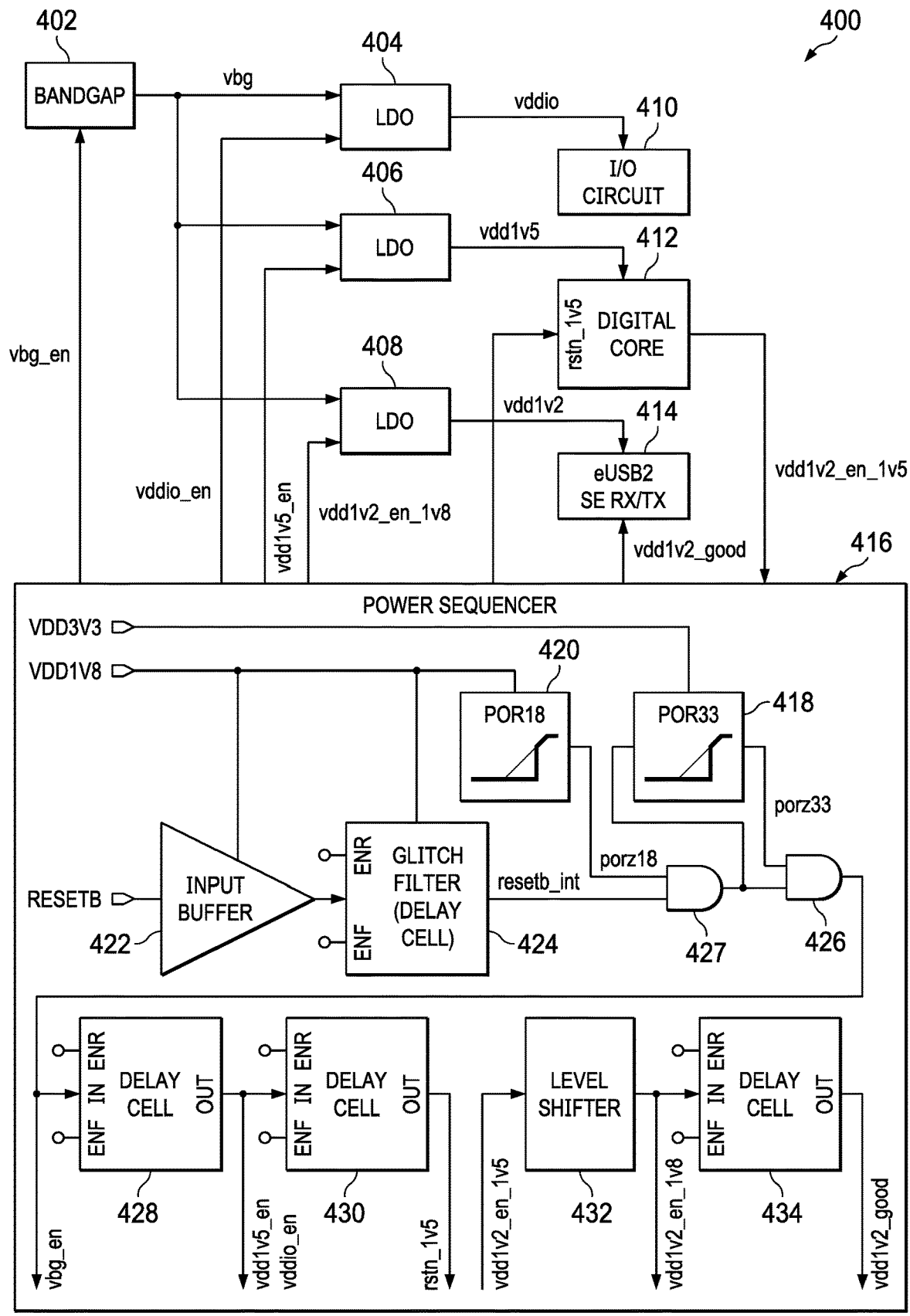
FIG. 4 shows a block diagram of an illustrative system in accordance with various examples.

Turning now to FIG. 4, a block diagram of an illustrative system 400 is shown. In at least some examples, the system 400 is illustrative of at least some components in an embedded Universal Serial Bus 2 (eUSB2) repeater, while in other examples the system 400 is representative of any device in which sequential (e.g., delayed) signal generation is advantageous. The system 400 includes, in some examples, a bandgap circuit 402, a low-dropout regulator (LDO) 404, a LDO 406, a LDO 408, an input/output (I/O) circuit 410, a digital core 412, a transmitter (TX) and/or receiver (RX) 414, and a power sequencer 416. In various examples, the system 400 includes any one or more additional components, devices, and/or circuits (not shown), any one or more of which, in various examples, correspond to additional outputs (not shown) of the power sequencer 416.

The power sequencer 416, in some examples, includes a power on reset (PoR) circuit 418, a PoR circuit 420, a buffer 422, a glitch filter 424, an AND logic circuit 426, an AND logic circuit 427, a delay cell 428, a delay cell 430, a level shifter 432, and a delay cell 434. In at least some examples, when the system 400 includes one or more additional components, devices, and/or circuits, as discussed above, the power sequencer 416 includes one or more additional delay cells (not shown) for use in generating control signals for the one or more additional components, devices, and/or circuits. In at least some examples, the circuit 100, discussed above with respect to FIG. 1, is suitable for implementation as the glitch filter 424, the delay cell 428, the delay cell 430, and/or the delay cell 434. The AND logic circuit 426 ad NAD logic circuit 427, in various examples, are each any one or more analog and/or digital components that individually, or collectively, are each suitable for implementing a logical AND operation to determine an output according to a plurality of inputs. The bandgap circuit 402, in some examples, is a bandgap generator configured to generate a bandgap reference voltage vbg. The LDO 404, in some examples, is configured to generate a voltage vddio for powering the I/O circuit 410. The LDO 406, in some examples, is configured to generate a voltage vdd1v5 (e.g., having a voltage of approximately 1.5 volts (v)) for providing as a power supply to the digital core 412). The I/O circuit 410 is any suitable I/O component, device, or circuit, the scope of which is not limited herein. The digital core 412 is and one or more components suitable for data processing, such as analog and/or digital logic components, a processor, microprocessor, etc. The TX/RX 414 is, in some examples, an eUSB2 single-ended TX/RX, and in some examples, is referred to as a transceiver.

In an example architecture of the system 400, the bandgap circuit 402 has an input coupled to the power sequencer 416, for example, at an output of the AND logic circuit 426 and an output coupled to inputs of the LDO 404, LDO 406, and LDO 408. The LDO 404 has an input coupled to the power sequencer 416, for example, at an output of the delay cell 428, and an output coupled to the I/O circuit 410. The LDO 406 has an input coupled to the power sequencer 416, for example, at an output of the delay cell 428 and an output coupled to the digital core 412. The LDO 408 has an input coupled to the power sequencer 416, for example, at an output of the level shifter 432 and an output coupled to the TX/RX 414. Another input of the digital core 412 is coupled to the power sequencer 416, for example, at an output of the delay cell 430. Another input of the TX/RX 414 is coupled to the power sequencer 416, for example, at an output of the delay cell 434. An output of the digital core 412 is coupled to the power sequencer 416, for example, at an input of the level shifter 432.

The PoR circuit 418 is configured to receive a signal VDD3V3 and an output of the PoR circuit 418 is coupled to a first input of the AND logic circuit 426. The PoR circuit 420 is configured to receive a signal VDD1V8 and an output of the PoR circuit 420 is coupled to a first input of the AND logic circuit 427. The buffer 422 is configured to receive a signal RESETB, an output coupled to an input of the glitch filter 424, and is configured to receive VDD1V8. The glitch filter 424 is configured to receive VDD1V8, signals ENR and ENF, and has an output coupled a second input of the AND logic circuit 427. An output of the AND logic circuit 427 is coupled to a second input of the AND logic circuit 426 and is coupled to the PoR circuit 418 to provide an enable signal to the PoR circuit 418. In this regard, the PoR circuit 418 is said to be gated by an output of the AND logic circuit 427 to, for example, minimize power consumption in some operation modes (e.g. such as when RESETB is held low and the power sequencer 416 is in a shutdown operation mode). An output of the AND logic circuit 426 is coupled to an input of the delay cell 428. An output of the delay cell 428 is coupled to an input of the delay cell 430. An output of the level shifter 432 is coupled to an input of the delay cell 434. Each of the delay cell 428, delay cell 430, and delay cell 434 is configured to receive separate and unique signals ENR and ENF.

Figure 5:
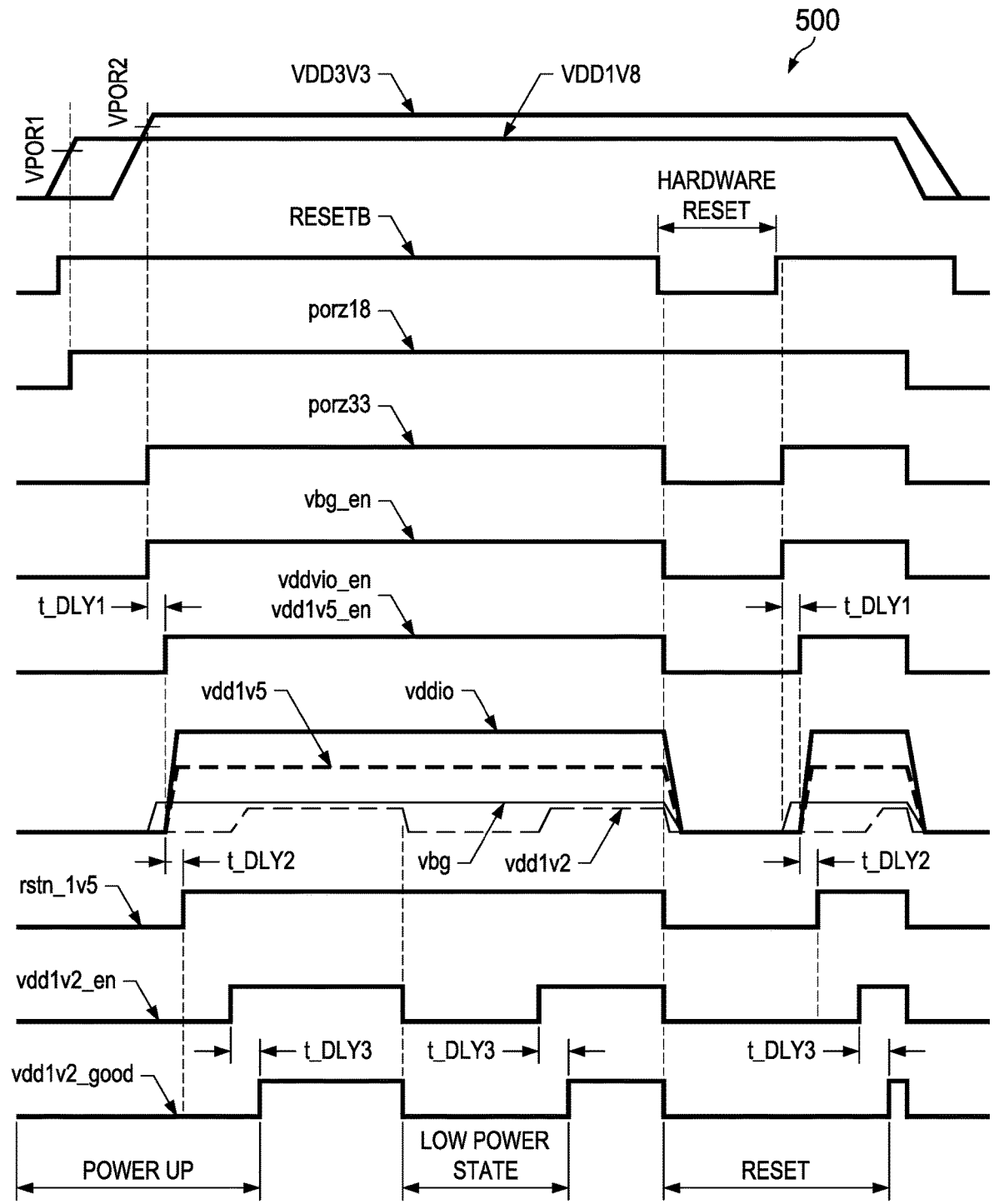
FIG. 5 shows a diagram of illustrative signal waveforms in accordance with various examples.

In an example of operation of the system 400, as is understood in conjunction with the signals illustrated in the diagram 500 of FIG. 5, the system 400 is configured to generate signals vbg_en, vdd1v5_en, vddio_en, rstn_1v5, vdd1v2_en_1v5, vdd1v2_en_1v8, and vdd1v2_good to control operation of bandgap circuit 402, LDO 404, LDO 406, LDO 408, I/O circuit 410, digital core 412, and TX/RX 414, in some examples, in a sequential, delayed, multi-stage, staggered, or other scheme of control (e.g., where various signals are asserted at various times to control a delay in operation of certain components of the system 400).

As discussed above, in at least some examples, the system 400 is representative of at least a portion of an eUSB2 repeater, such as an eUSB2 to USB2 repeater. An eUSB2 to USB2 repeater facilitates communication at voltage levels specified according to eUSB2 specification and at voltage levels specified according to USB2 specification. Accordingly, in at least some examples, an eUSB2 to USB2 repeater includes a plurality of regulators (e.g., the LDO 404, LDO 406, and LDO 408) to generate voltages used in facilitating the communication and conversion from the eUSB2 voltage levels to the USB2 voltage levels or vice versa. The power sequencer 416, in some examples, generates a plurality of control signals to provide for a managed sequence of activation of components of the system 400 to facilitate operation of the components of the system 400 when dependencies exist between the components of the system 400 (e.g., such as activation of a voltage regulator prior to activation of a circuit that is powered by the voltage regulator).

The bandgap generator 402 is configured to generate the reference voltage vbg for use by each of the LDO 404, LDO 406, and LDO 408. VDD3V3 and VDD1V8, in some examples, are received from external power supplies (not shown) and are monitored by the power sequencer 416 using the PoR circuit 418 and the PoR circuit 420. When an output of the PoR circuit 420 (porz18) and RESETB are each de-asserted (e.g., have values of logical '1' when an asserted state is defined as a logical '0' value), the AND logic circuit 427 outputs a logical '1'. Otherwise, the AND logic circuit 427 outputs a logical '0'. When the AND logic circuit 427 outputs the logic '1', the PoR circuit 418 activates. When the PoR circuit 418 is de-asserted, and the output of the AND logic circuit 427 is the logical '1', the AND logic circuit 426 outputs a logical '1' to control the bandgap circuit 402 to activate and generate vbg. Otherwise, the AND logic circuit 426 outputs a logical '0' and controls the bandgap generator 402 to deactivate and/or cease generating vbg. Porz18 is de-asserted, in some examples, when VDD1V8 exceeds a threshold VPOR1 of the PoR circuit 420. Porz33 is de-asserted, in some examples, when VDD3V3 exceeds a threshold VPOR2 of the PoR circuit 418, where VPOR2 is greater than VPOR1. The delay cell 428 delays vbg for a period t_DLY1, using techniques described elsewhere herein, and outputs vdd1v5_en and vddio_en at the expiration of t_DLY1. The time t_DLY1, in some examples, provides for a settling time for vbg after startup of the bandgap circuit 402.

The delay cell 430 delays the output of the delay cell 428 for a period t_DLY2, using techniques described elsewhere herein, and de-asserts rstn_1v5 (e.g., outputting rstn_1v5, in some examples, having a logical '1' value) at the expiration of t_DLY2. The time t_DLY2, in some examples, provides for a settling time for vddio and vdd1v5 after startup of the LDO 404 and the LDO 406, respectively. When rstn_1v5 is de-asserted, the digital core 412 begins operating and asserts vdd1v2_en_1v5 (e.g., outputting vdd1v2_en_1v5 having a logical '1' value). The level shifter 432 shifts a voltage level of vdd1v2_en_1v5 and outputs the resulting signal as vdd1v2_en_1v8. The delay cell 434 delays vdd1v2_en_1v8 for a period t_DLY3 to enable vdd1v2 to settle after startup of the LDO 408 and generates vdd1v2_good according to vdd1v2_en_1v8 at the expiration of t_DLY3.

In at least some examples, the glitch filter 424 filters glitches present in a buffered output of RESETB to generate resetb_int by delaying generation of resetb_int, thereby preventing resetb_int from immediately reflecting glitches present in RESETB until a duration of time of a change in value of RESETB exceeds a delay of the glitch filter 424. Each of the glitch filter 424, delay cell 428, delay cell 430, and delay cell 434 are configured to couple to nodes to receive ENR and/or ENF. A particular node to which the glitch filter 424, delay cell 428, delay cell 430, and delay cell 434 depends on a desired operation of the power sequencer 416. In various examples, the glitch filter 424, delay cell 428, delay cell 430, and delay cell 434 are each individually configurable for rising edge delay, falling edge delay, both rising edge delay and falling edge delay, or no delay, according to the signals ENR and ENF, as discussed elsewhere herein. For example, in at least one example, the glitch filter 424 is configured to receive VDD1V8 at both ENR and ENF nodes of the glitch filter 424 to enable both rising and falling edge delay by the glitch filter 424. Similarly, the delay cell 428, delay cell 430, and delay cell 434 are each configured to receive VDD1V8 at ENR nodes and couple to a ground potential at ENF nodes to enable rising edge delay only in the delay cell 428, delay cell 430, and delay cell 434. In other application environments, couplings of ENR and/or ENF nodes of the glitch filter 424, delay cell 428, delay cell 430, and delay cell 434 vary according to the teachings herein. Each of the signals discussed above is illustrated in the diagram 500, which illustrates an example startup power sequence of the system 400 during power up, lower power state, and reset phases of operation.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, drain-extended, natural, etc.), these components may be exchanged for components of other process technologies (e.g., replace FET and/or metal oxide semiconductor FET (MOSFET) with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a signal detection circuit having a first input configured to receive an input signal (IN), a second input configured to receive an output signal (OUT), and an output;
a first n-type field effect transistor (FET)(nFET) having a gate terminal coupled to the output of the signal detection circuit, a drain terminal, and a source terminal coupled to a first node;
a resistor coupled between the drain terminal of the first nFET and a second node;
a first current mirror coupled between the first node and a third node;
a second current mirror coupled between the second node and a fourth node;
a first p-type FET (pFET) having a gate terminal configured to receive IN, a source terminal coupled to the fourth node, and a drain terminal coupled to a fifth node;
a second nFET having a gate terminal configured to receive IN, a source terminal coupled to the third node, and a drain terminal coupled to the fifth node;
a capacitor coupled between the fifth node and ground; and
a Schmitt trigger having an input coupled to the fifth node and an output coupled to a sixth node, wherein the Schmitt trigger is configured to provide OUT at the sixth node;
wherein the signal detection circuit comprises:
an exclusive NOR logic circuit having a first input configured to receive IN, a second input configured to receive OUT, and an output;
a first NOR logic circuit having a first input configured to receive an enable falling edge delay signal (ENF), a second input configured to receive an enable rising edge delay signal (ENR), and an output; and
a second NOR logic circuit having a first input coupled to the output of the exclusive NOR logic circuit, a second input coupled to the output of the first NOR logic circuit, and an output coupled to the gate terminal of the first nFET.

2. A circuit, comprising:
a signal detection circuit having a first input configured to receive an input signal (IN), a second input configured to receive an output signal (OUT), and an output;
a first n-type field effect transistor (FET)(nFET) having a gate terminal coupled to the output of the signal detection circuit, a drain terminal, and a source terminal coupled to a first node;
a resistor coupled between the drain terminal of the first nFET and a second node;
a first current mirror coupled between the first node and a third node;
a second current mirror coupled between the second node and a fourth node;
a first p-type FET (pFET) having a gate terminal configured to receive IN, a source terminal coupled to the fourth node, and a drain terminal coupled to a fifth node;
a second nFET having a gate terminal configured to receive IN, a source terminal coupled to the third node, and a drain terminal coupled to the fifth node;
a capacitor coupled between the fifth node and a ground terminal; and
a Schmitt trigger having an input coupled to the fifth node and an output coupled to a sixth node, wherein the Schmitt trigger is configured to provide OUT at the sixth node;
wherein the signal detection circuit comprises an exclusive OR logic circuit having a first input configured to receive IN, a second input configured to receive OUT, and an output coupled to the gate terminal of the first nFET.

3. A circuit, comprising:
a signal detection circuit having a first input configured to receive an input signal (IN), a second input configured to receive an output signal (OUT), and an output;
a first n-type field effect transistor (FET)(nFET) having a gate terminal coupled to the output of the signal detection circuit, a drain terminal, and a source terminal coupled to a first node;
a resistor coupled between the drain terminal of the first nFET and a second node;
a first current mirror coupled between the first node and a third node;
a second current mirror coupled between the second node and a fourth node;
a first p-type FET (pFET) having a gate terminal configured to receive IN, a source terminal coupled to the fourth node, and a drain terminal coupled to a fifth node;
a second nFET having a gate terminal configured to receive IN, a source terminal coupled to the third node, and a drain terminal coupled to the fifth node;
a capacitor coupled between the fifth node and a ground terminal; and
a Schmitt trigger having an input coupled to the fifth node and an output coupled to a sixth node, wherein the Schmitt trigger is configured to provide OUT at the sixth node;
further comprising:
a second pFET having a gate terminal coupled to a seventh node and configured to receive an enable falling edge delay signal (ENF), a source terminal coupled to an eighth node and a drain terminal coupled to the fourth node;
a third nFET having a gate terminal, a drain terminal coupled to the third node, and a source terminal coupled to the ground terminal; and
an inverter coupled between a ninth node configured to receive an enable rising edge delay signal (ENR) and the gate terminal of the third nFET.

4. A circuit, comprising:
a signal detection circuit having a first input configured to receive an input signal (IN), a second input configured to receive an output signal (OUT), and an output;
a first n-type field effect transistor (FET)(nFET) having a gate terminal coupled to the output of the signal detection circuit, a drain terminal, and a source terminal coupled to a first node;
a resistor coupled between the drain terminal of the first nFET and a second node;

a first current mirror coupled between the first node and a third node;

a second current mirror coupled between the second node and a fourth node;

a first p-type FET (pFET) having a gate terminal configured to receive IN, a source terminal coupled to the fourth node, and a drain terminal coupled to a fifth node;

a second nFET having a gate terminal configured to receive IN, a source terminal coupled to the third node, and a drain terminal coupled to the fifth node;

a capacitor coupled between the fifth node and a ground terminal; and a Schmitt trigger having an input coupled to the fifth node and an output coupled to a sixth node, wherein the Schmitt trigger is configured to provide OUT at the sixth node;

further comprising:

a third pFET having a gate terminal coupled to the fifth node, a drain terminal coupled to the fourth node, and a source terminal coupled to an eighth node; and a fourth nFET having a gate terminal coupled to the fifth node, a drain terminal coupled to the ground terminal, and a source terminal coupled to the third node.

5. A circuit, comprising:

a signal detection circuit having a first input configured to receive an input signal (IN), a second input configured to receive an output signal (OUT), and an output;

a first n-type field effect transistor (FET)(nFET) having a gate terminal coupled to the output of the signal detection circuit, a drain terminal, and a source terminal coupled to a first node;

a resistor coupled between the drain terminal of the first nFET and a second node;

a first current mirror coupled between the first node and a third node;

a second current mirror coupled between the second node and a fourth node;

a first p-type FET (pFET) having a gate terminal configured to receive IN, a source terminal coupled to the fourth node, and a drain terminal coupled to a fifth node;

a second nFET having a gate terminal configured to receive IN, a source terminal coupled to the third node, and a drain terminal coupled to the fifth node;

a capacitor coupled between the fifth node and a ground terminal; and a Schmitt trigger having an input coupled to the fifth node and an output coupled to a sixth node, wherein the Schmitt trigger is configured to provide OUT at the sixth node;

further comprising a buffer having an input coupled to the sixth node and an output coupled to the ground terminal, wherein the buffer is configured to provide OUT at the ground terminal.

6. A system, comprising:

a first power on reset (PoR) circuit having an input configured to receive a first supply voltage;

a second PoR circuit having an input configured to receive a second supply voltage;

a buffer configured to receive a reset signal and output a buffered reset signal;

a glitch filter configured to receive the buffered reset signal and generate a delayed internal reset signal;

a first logic circuit configured to output a first logic output signal based on a value of an output signal of the first PoR circuit and the internal reset signal;

a second logic circuit configured to output a first control signal based on a value of an output signal of the second PoR circuit and an output signal of the first logic output circuit; and a delay cell configured to receive the first control signal and generate a second control signal having a value reflecting a value of the first control signal after a first delay period.

7. The system of claim 6, further comprising a second delay cell configured to receive the second control signal and generate a third control signal having a value reflecting the value of the second control signal after a second delay period.

8. The system of claim 7, further comprising:

a bandgap circuit configured to receive the first control signal and output a reference voltage when the first control signal is asserted;

a first voltage regulator configured to receive the reference voltage and the second control signal and output a third supply voltage to an input/output circuit when the second control signal is asserted;

a second voltage regulator configured to receive the reference voltage and the second control signal and output a fourth supply voltage when the second control signal is asserted; and a digital core configured to receive the fourth supply voltage and output a fourth control signal when the third control signal is de-asserted.

9. The system of claim 8, further comprising:

a level shifter configured to receive the fourth control signal and generate a fifth control signal; and a third delay cell configured to receive the fifth control signal and generate a sixth control signal having a value reflecting a value of the fifth control signal after a third delay period.

10. The system of claim 9, further comprising:

a third voltage regulator configured to receive the reference voltage and the fifth control signal and output a fifth supply voltage when the second control signal is asserted; and a transceiver configured to receive the fifth supply voltage and the sixth control signal and perform an operation when the sixth control signal is asserted.

11. The system of claim 10, wherein the transceiver is an embedded Universal Serial Bus 2 single-ended transceiver.

12. The system of claim 6, wherein the glitch filter and the delay cell each individually comprise:

a signal detection circuit having a first input configured to receive an input signal (IN), a second input configured to receive an output signal (OUT), and an output;

a first n-type field effect transistor (FET)(nFET) having a gate terminal coupled to the output of the signal detection circuit, a drain terminal, and a source terminal coupled to a first node;

a resistor coupled between the drain terminal of the first nFET and a second node;

a first current mirror coupled between the first node and a third node;

a second current mirror coupled between the second node and a fourth node;

a first p-type FET (pFET) having a gate terminal configured to receive IN, a source terminal coupled to the fourth node, and a drain terminal coupled to a fifth node;

a second nFET having a gate terminal configured to receive IN, a source terminal coupled to the third node, and a drain terminal coupled to the fifth node;

a capacitor coupled between the fifth node and a ground terminal; and a Schmitt trigger having an input coupled to the fifth node and an output coupled to a sixth node, wherein the Schmitt trigger is configured to provide OUT at the sixth node.

\* \* \* \* \*